United States Patent
Sun et al.

(10) Patent No.: US 8,076,779 B2
(45) Date of Patent: Dec. 13, 2011

(54) REDUCTION OF MACRO LEVEL STRESSES IN COPPER/LOW-K WAFERS

(75) Inventors: Sey-Shing Sun, Portland, OR (US); Jayanthi Pallinti, Santa Clara, CA (US); Dilip Vijay, Redwood City, CA (US); Hemanshu Bhatt, Vancouver, WA (US); Hong Ying, Cupertino, CA (US); Chiyi Kao, San Jose, CA (US); Peter Burke, Portland, OR (US)

(73) Assignee: LSI Corporation, Milpitas, CA (US)

( * ) Notice: Subject to any disclaimer, the term of this patent is extended or adjusted under 35 U.S.C. 154(b) by 166 days.

(21) Appl. No.: 11/269,275

(22) Filed: Nov. 8, 2005

(65) Prior Publication Data

US 2007/0102812 A1     May 10, 2007

(51) Int. Cl.
*H01L 23/48* (2006.01)
*H01L 23/52* (2006.01)
*H01L 29/40* (2006.01)

(52) U.S. Cl. ........ 257/758; 257/734; 257/751; 257/774; 257/775; 257/E25.029; 257/E25.011; 257/E23.073; 257/E23.025; 257/E23.024; 257/E23.021; 257/E21.508

(58) Field of Classification Search ............. 257/774, 257/734, E21.309, E21.508, E23.021, E23.024, 257/E23.025, E23.073, E25.011, E25.029, 257/751, 775, 758, 499; 438/612–614
See application file for complete search history.

(56) References Cited

U.S. PATENT DOCUMENTS

| | | | |
|---|---|---|---|
| 6,020,640 A * | 2/2000 | Efland et al. .................. 257/751 |
| 6,096,649 A * | 8/2000 | Jang .............................. 438/687 |
| 6,472,304 B2 * | 10/2002 | Chittipeddi et al. .......... 438/612 |
| 6,620,720 B1 * | 9/2003 | Moyer et al. ................... 438/612 |
| 6,703,069 B1 * | 3/2004 | Moon et al. ................... 427/123 |
| 6,979,647 B2 * | 12/2005 | Bojkov et al. ................. 438/687 |
| 2002/0086533 A1 * | 7/2002 | Jang et al. ..................... 438/689 |
| 2003/0107137 A1 * | 6/2003 | Stierman et al. .............. 257/763 |
| 2003/0230809 A1 * | 12/2003 | Nakajima et al. ............. 257/758 |
| 2004/0209406 A1 * | 10/2004 | Jan et al. ........................ 438/148 |
| 2005/0048798 A1 * | 3/2005 | Bojkov et al. ................. 438/784 |
| 2005/0215048 A1 * | 9/2005 | Li et al. .......................... 438/622 |
| 2006/0091536 A1 * | 5/2006 | Huang et al. .................. 257/734 |
| 2007/0023919 A1 * | 2/2007 | Lin et al. ........................ 257/774 |

* cited by examiner

*Primary Examiner* — Meiya Li
(74) *Attorney, Agent, or Firm* — Clark Hill PLC

(57) ABSTRACT

A pad structure and passivation scheme which reduces or eliminates IMC cracking in post wire bonded dies during Cu/Low-k BEOL processing. A thick 120 nm barrier layer can be provided between a 1.2 μm aluminum layer and copper. Another possibility is to effectively split up the barrier layer, where the aluminum layer is disposed between the two barrier layers. The barrier layers may be 60 nm while the aluminum layer which is disposed between the barrier layers may be 0.6 μm. Another possibility is provide an extra 0.6 μm aluminum layer on the top barrier layer. Still another possibility is to provide an extra barrier layer on the top-most aluminum layer, such that a top barrier layer of 60 nm is provided on a 0.6 μm aluminum layer, followed by another barrier layer of 60 nm, another aluminum layer of 0.6 μm and another barrier layer of 60 nm.

4 Claims, 6 Drawing Sheets

REDUCTION OF MACRO LEVEL STRESSES IN COPPER/LOW-K WAFERS

BACKGROUND OF THE INVENTION

The present invention generally relates to wire bonds, and more specifically relates to pad structures and passivation schemes to reduce or eliminate intermetallic compound (IMC) cracking in post wire bonded dies during Cu/Low-k BEOL processing (that portion of the integrated circuit fabrication where the active components are interconnected with wiring on the wafer).

It has been observed that some post wire bonded dies that have undergone Cu/Low-k metallization show signature of 'open' fails after several hours of HTS (high temperature storage). Failure analysis on such parts shows cracks at the interface of intermetallic compound (IMC) and gold bond. FIG. 1 shows an X-SEM of a bonded die with IMC cracking.

Historically, IMC cracking in Au—Al wire bonds have been attributed to several causes including contamination on the surface of the Al-pads, incompatible film properties of the Al-films, presence of halides in the molding compounds, excessive levels of voids in the molding compounds and poorly optimized bonding and molding conditions. However, in the case of wire bond devices with Cu/Low-k metallization, the cracking of IMC persists despite careful control of the above-mentioned factors. Through a cumulative set of deductive experiments and use advanced analytical techniques, it has been determined that the cracking of IMC wire bond devices with Cu/Low-k metallization is a strong function of the tensile stresses in the film. It has been found that the unusually high tensile stresses generated in the Cu/Low-k stacks can drive excessive diffusion of Al into the Au bonds leading to very thick and Al-rich IMC phases. The unstable Al-rich phases eventually undergo reverse phase transformations to Au-rich phases; the associated volume change (very large ~30%) in such phase transformations can result in voiding and eventual cracking of the IMC. The way to prevent this issue then is to tailor the stresses in the Cu/Low-k stacks so that the Al-diffusion rates are controlled to a low enough level that the stable Au-rich phases are formed preferably when compared to Al-rich phases. This will prevent any tendencies for phase transformation in the system.

Stress Build-Up:

The present invention addresses the stress related issues that cause the IMC cracking and methods to eliminate the IMC cracking by controlling the macro stresses in the wafer. During Cu/Low-k processing, it has been found that there is cumulative stress buildup in wafers due to intrinsic stresses in metal and dielectric films and due to various thermal cycles. Thermal stresses are generated due to a mismatch between the temperature coefficients of expansion between metal, dielectric films and substrate, as illustrated in the following table:

| Material | Coefficient of thermal expansion for various film (per degree Celsius) |
| --- | --- |
| Al | 2.2E−05 |
| Cu | 1.7E−05 |
| Ti/TiN | 9.0E−06 |
| Ta/TaN | 6.0E−06 |
| Si | 3.0E−06 |
| $SiO_2$ | 5.5E−07 |

Intrinsic stresses are generated during deposition. The stress state can be evaluated with freestanding films (or films on flexible substrates). Some general observations regarding stresses in thin films is provided below for reference:

1. Tensile: typically, an upward curve is generated due to repulsive forces between tapered grains in the structure formed by evaporation or sputtering with high pressure and low power.
2. Compressive: typically, a downward curve is generated due to atomic peening of crystal grains by reflected neutrons during sputtering.
3. Metals with Body Centered Cubic (BCC) structure, e.g., W, Ta (mostly refractory metals), can have extremely high compressive stress due to open lattice that allows atoms to be easily displaced.
4. Metals with Face Centered Cubic (FCC) structure, e.g., Cu, Al and Au (most noble metals), have very little intrinsic stress (low re-crystallization temperature).
5. Dielectric (CVD) films can be tensile or compressive depending on deposition parameters, e.g., temperature and plasma power.

The macro stresses in the wafer can be measured by measuring the bow in the wafer and translating the values to stresses through Poisson's equations. In general, a positive wafer gap during the wafer bow measurement indicates tensile stresses in the wafers and a negative wafer gap indicates compressive stresses. FIG. 2 shows a normalized graph with stress accumulated on a wafer at various stages in the BEOL Cu/Low-k wafer processing.

It is evident from FIG. 2 that the tensile stresses on the wafer keep increasing in the wafer as more and more metallization steps (M2, M3, M4, M5, M6, MR1, MR2, Pass 1 dep, Alloy, Al Pad, Pass 2 dep) are added to the film and the wafer experiences maximum tensile stress during deposition of the Aluminum pad. Aluminum and copper are known to contribute to tensile stresses, while the dielectric films can contribute to tensile or compressive stresses based on deposition conditions like temperature, time, etc. As the tensile stresses in the wafer build-up, the wafer can bow due to the warpage or macro stress distributions from the center to the edge of the wafer. However, the local stress distribution in the Aluminum pads is harder to characterize.

Ideally, during gold wire bonding, an Au—Al intermetallic compound (IMC) is formed at the interface of Aluminum and gold. For a stable bond, the IMC formed is uniform, rich in gold and typically about 2-3 μm and this is achieved when the stress state of Aluminum is mostly neutral. However, when Aluminum is in a highly tensile stress state, the lattice spacing between Aluminum atoms are stretched open, there is a high tendency for Au atoms to diffuse into Aluminum to form a brittle Aluminum rich Au—Al IMC. Aluminum rich Al—Au IMC is non-uniform and much thicker than normal IMC (~5 μm vs. 2 μm). Due to non-uniformity and larger thickness of IMC, the interface is prone to voids and the voids merge to form a crack between the IMC and the gold wire, thus causing an "open failure".

OBJECTS AND SUMMARY

An object of an embodiment of the present invention is to provide a pad structure which is designed to resist IMC cracking.

Another object of an embodiment of the present invention is to provide a passivation scheme which reduces or eliminates IMC cracking in post wire bonded dies during Cu/Low-k BEOL processing.

Briefly, and in accordance with at least one of the foregoing objects, one embodiment of the present invention provides a pad structure which includes a relatively thick barrier layer between an aluminum layer and a copper layer. Specifically, the barrier layer may be 120 nm and the aluminum layer may be 1.2 μm.

Another embodiment provides that the barrier layer is effectively split up and the aluminum layer is disposed between the two barrier layers. Specifically, the top and bottom barrier layers may be 60 nm while the aluminum layer which is disposed between the two barrier layers may be 0.6 μm.

In yet another embodiment, an extra aluminum layer is disposed on the top barrier layer such that a top layer of aluminum is provided at 0.6 μm, followed by a barrier layer of 60 nm, followed by another 0.6 μm layer of aluminum, and another 60 nm barrier layer.

In still yet another embodiment, an extra barrier layer is provided on the top-most aluminum layer, such that a top barrier layer of 60 nm is provided on a 0.6 μm aluminum layer, followed by another barrier layer of 60 nm, another aluminum layer of 0.6 μm and another barrier layer of 60 nm.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DETAILED DESCRIPTION OF EMBODIMENT OF THE INVENTION

Figure 1:
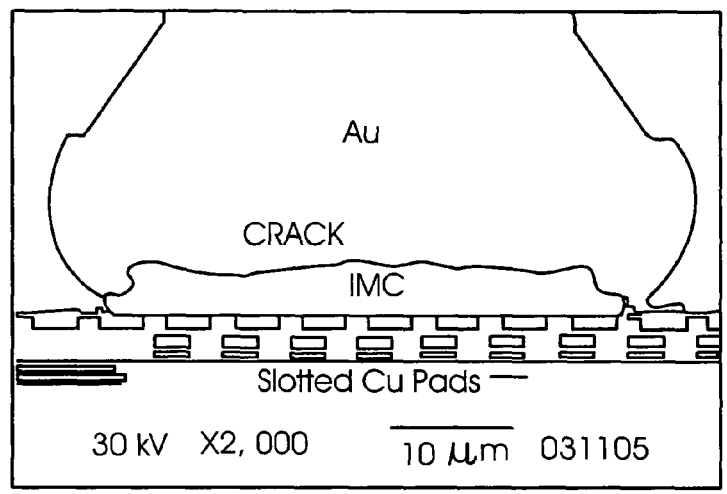
FIG. 1 is an X-SEM of a bonded die, showing IMC cracking.
Figure 2:
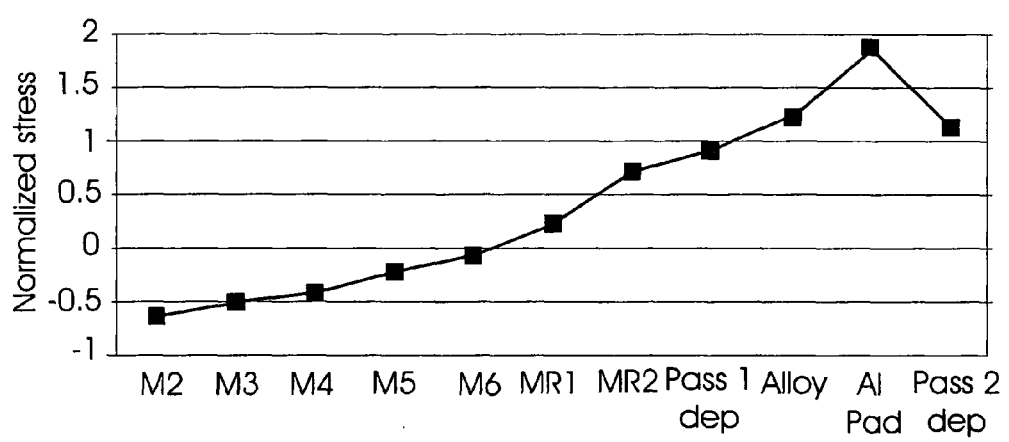
FIG. 2 is a graph which shows normalized stress on a wafer at various metallization steps in the BEOL Cu/Low-k steps, wherein a positive value for stress indicates tensile stress and a negative value for stress indicates compressive stress.
Figure 3:
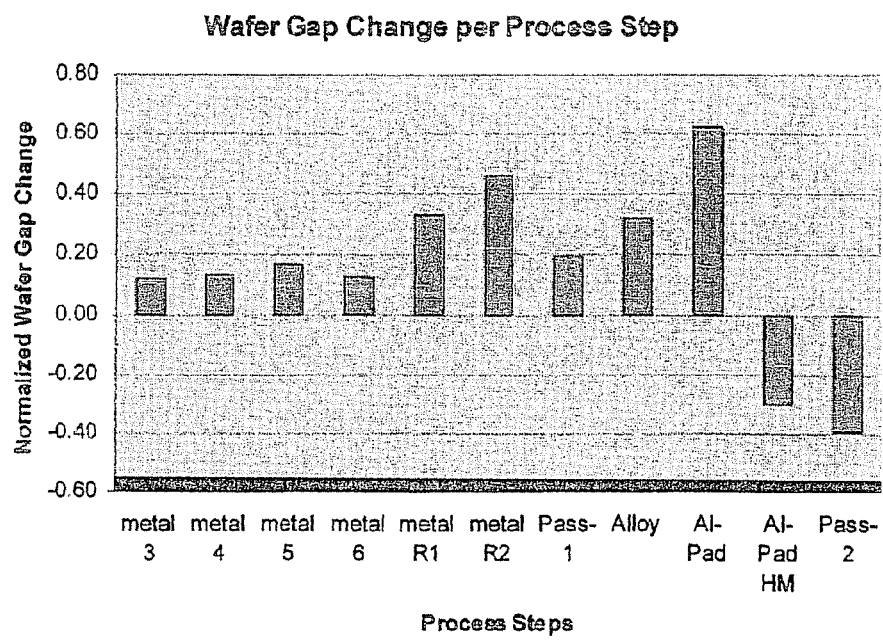
FIG. 3 is a graph which shows the normalized wafer gap change per process step, wherein a positive value for stress indicates tensile stress and a negative value for stress indicates compressive stress.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 5:
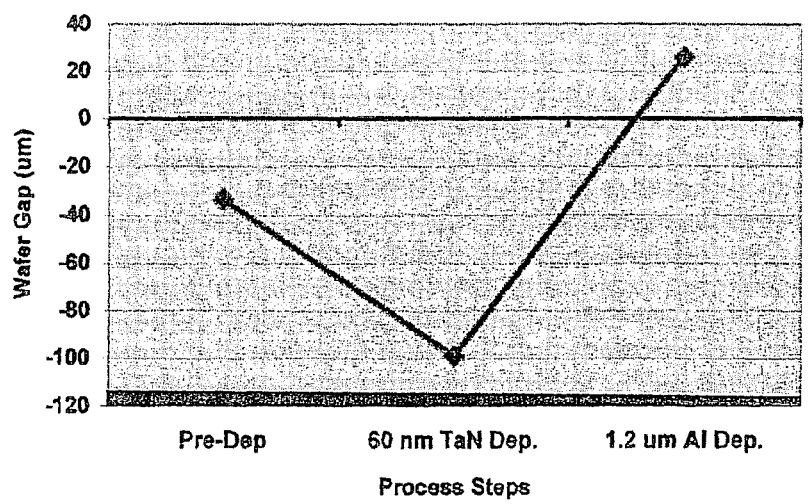
FIG. 5 is a graph which shows the stress evolution in a conventional Aluminum-pad stack during deposition as indicated by wafer bow measurement.
Figure 4:
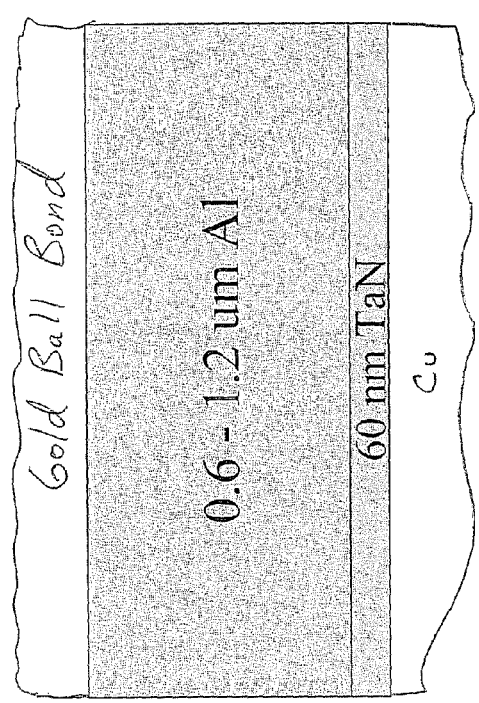
FIG. 4 is a cross-sectional view of a conventional Al-pad stack.

A conventional Al pad stack is illustrated in FIG. 4 and consists of a thin TaN barrier metal and a thick Cu doped Al (0.5 at. %) layer (referred to as Al in the following discussion). The thin TaN barrier metal is about 60 nm thick and is needed to prevent interdiffusion between Cu and Al. The Al layer is about 0.6-1.2 μm thick depending on the application and is deposited at a high temperature, e.g., 180 C. to achieve desirable crystallinity. During cool down, Al films contract more than dielectric and Si substrates due to its relatively large thermal coefficient of expansion, e.g., 25 ppm/C in Al vs. 2-3 ppm in Si and $SiO_2$, but was refrained and stretched by the rigid Si substrate, and hence in a highly tensile state, e.g., $0.2 \times 10^9$ dyne/cm². FIG. 5 shows the stress state evolution of film stack in a wafer during Al-Pad deposition as indicated by wafer bow measurement. The stress in TaN is highly compressive but the tensile stress in Al layer is even larger (due to a much larger thickness) and resulted in a net tensile stress after Al-Pad deposition.

To reduce the macro tensile stress in Al-Pad stack, the following stack configurations are proposed, each with different arrangement of TaN and Al layers in the stack but all with higher total thickness of TaN.

(a) TaN (120 nm)-Al (1.2 μm)
(b) TaN (60 nm)-Al (0.6 μm)-TaN(60 nm)
(c) TaN (60 nm)-Al (0.6 μm)-TaN(60 nm)-Al(0.6 μm)
(d) TaN (60 nm)-Al (0.6 μm)-TaN(60 nm)-Al(0.6 μm)-TaN (60 nm)

Figure 6:
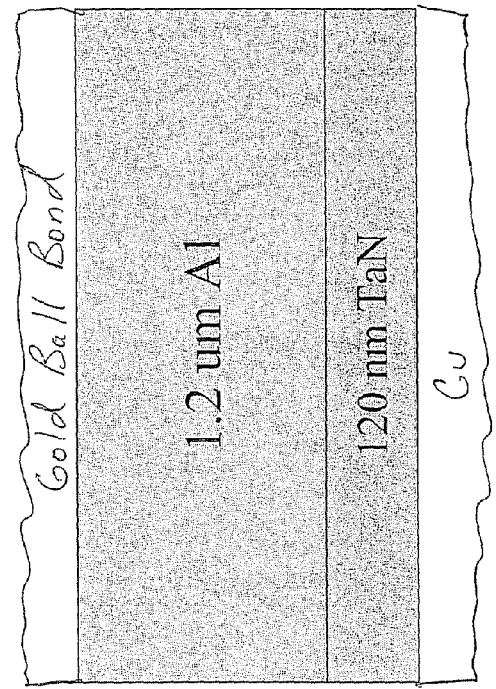
FIGS. 6-9 are similar to FIG. 4, but illustrate pad structures which are in accordance with different embodiments of the present invention.
Figures 7, 8:
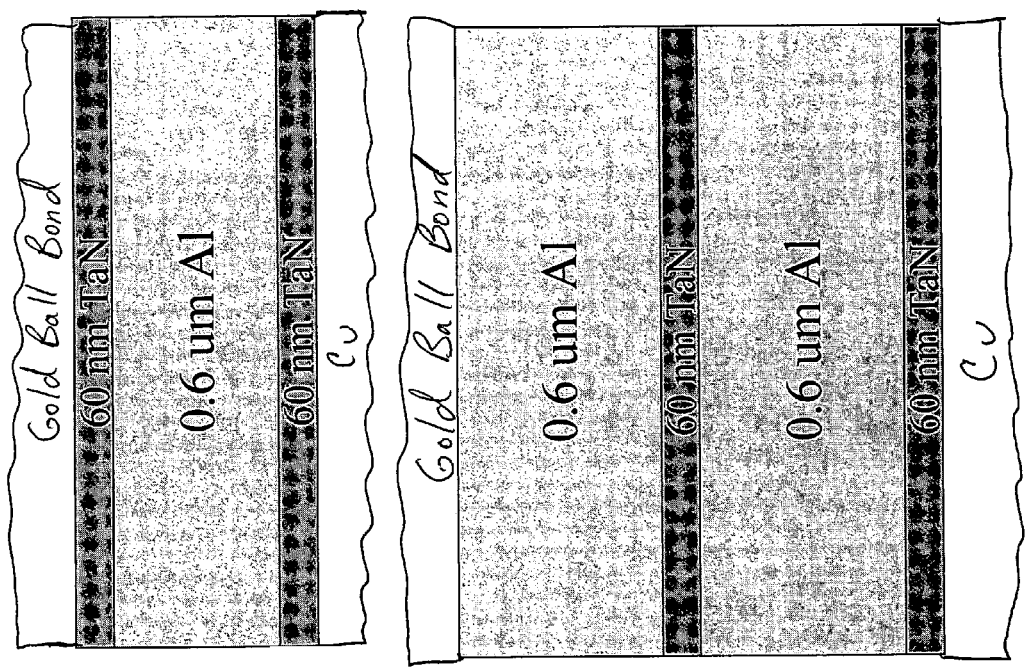
Figure 9:
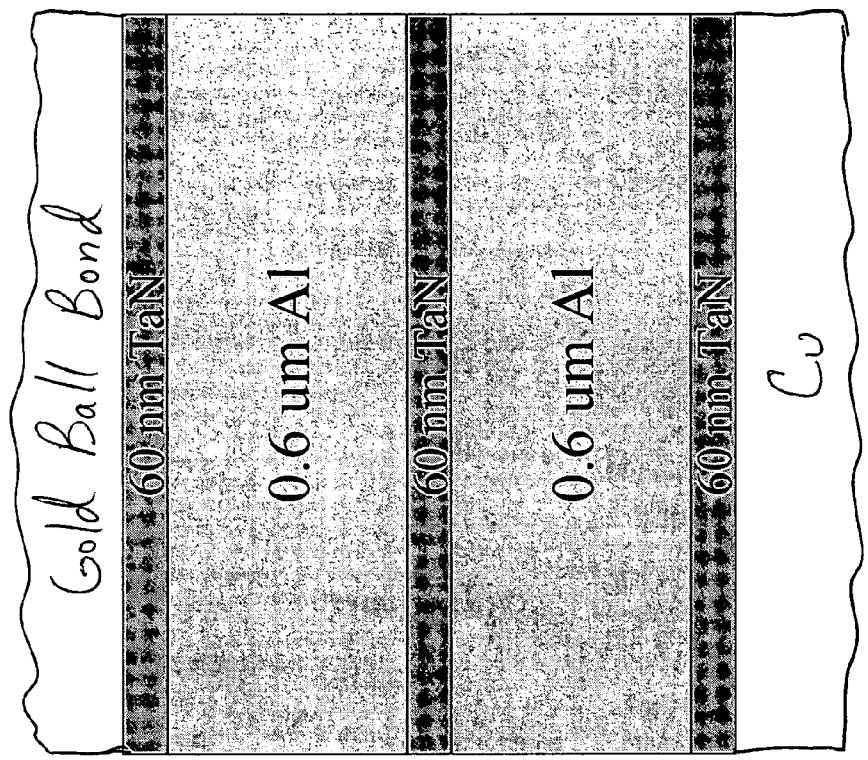

While FIG. 6 illustrates structure (a), FIG. 7 illustrates structure (b), FIG. 8 illustrates structure (c), and FIG. 9 illustrates structure (b)

Figure 10:
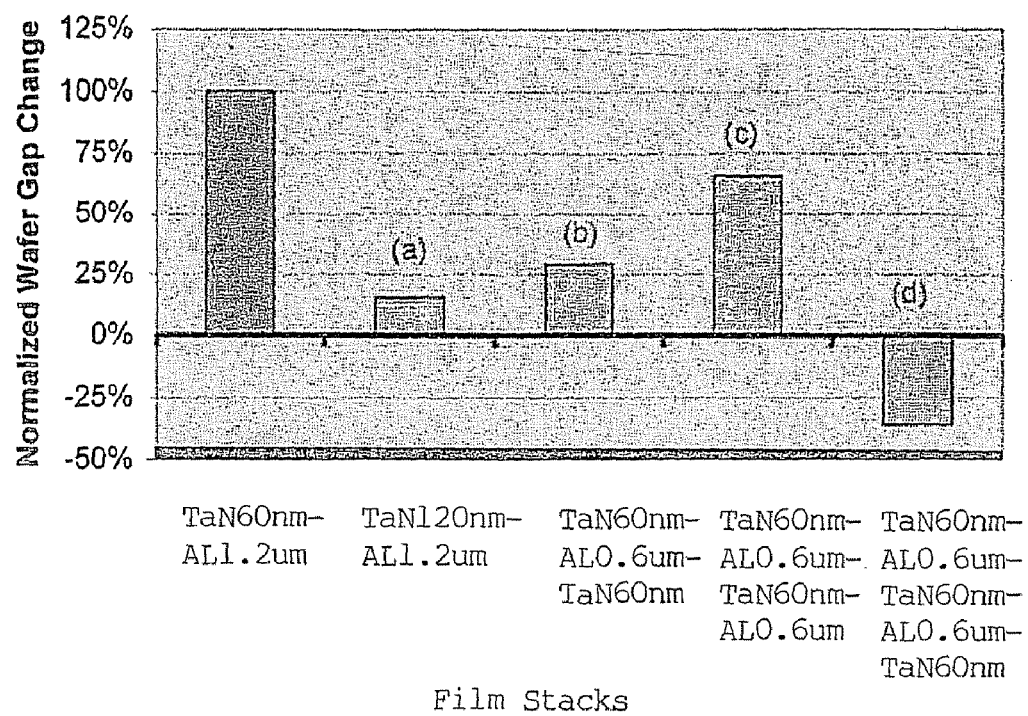
FIG. 10 is a graph which shows the normalized wafer gap change for each of the pad structures shown in FIGS. 4, 6, 7, 8 and 9.

As shown in FIG. 10, each of the stacks illustrated in FIGS. 6-9 yielded smaller wafer bow than a conventional stack (as shown in FIG. 4) with 60 nm TaN and 1.2 μm Al (TaN600-Al12K). The stack (d) (FIG. 9), i.e., TaN (60 nm)-Al (0.6 μm)-TaN(60 nm)-Al(0.6 μm)-TaN(60 nm), actually bows in the compressive direction possibly due to the fact that it has the thickest TaN, e.g., 180 nm TaN, of each of the four proposed stacks, effectively proving that a highly compressive barrier layer, i.e., TaN, can counterbalance the tensile stress from Aluminum.

With lower tensile stress in the stacks, there is less driving force for Au to interact with Al to form IMC (see FIG. 1) and hence more remaining Al layer for reliable mechanical support. The same IMC limiting action can be achieved with stacks (c) (FIG. 8) and (d) (FIG. 9) where a TaN layer was inserted midway between 1.2 μm Al. Only the top 0.6 μm Al is allowed to interact with Au (see FIG. 1) and the lower 0.6 μm remains intact to provide robust mechanical support.

In addition to TaN, other copper metal diffusion barriers, e.g., TiN, W, WN, WCN, Ru can also be used in similar schemes to reduce tensile stress in Al-Pad and improve wire bonding reliability.

While embodiments of the present invention are shown and described, it is envisioned that those skilled in the art may devise various modifications of the present invention without departing from the spirit and scope of the appended claims.

What is claimed is:

1. A pad structure for gold ball wire bonding, said pad structure comprising: a copper layer; a first barrier layer on, and in physical contact with, the copper layer, a first aluminum layer on, and in physical contact with, the first barrier layer; a second barrier layer on, and in physical contact with, the first aluminum layer, a second aluminum layer on, and in physical contact with, said second barrier layer, and a third barrier layer on, and in physical contact with, the second aluminum layer, wherein the first, second and third barrier layers are of the same thickness, and the first and second aluminum layers are of the same thickness, wherein each of the first and second aluminum layers is ten times thicker than each of the first, second and third barrier layers, wherein the third barrier layer is configured for bonding to a gold ball.

2. A pad structure as recited in claim 1, wherein the first and second barrier layers are each 60 nm thick, and the first aluminum layer and the second aluminum layer are each 0.6 μm thick.

3. A pad structure as recited in claim 1, wherein the first, second and third barrier layers are of the same thickness, and the first aluminum layer and the second aluminum layer are of the same thickness, and wherein each of the aluminum layers is ten times thicker than each of the first, second and third barrier layers.

4. A pad structure as recited in claim 1, wherein the first, second and third barrier layers are each 60 nm thick, and the first aluminum layer and the second aluminum layer are each 0.6 μm thick.

\* \* \* \* \*